(12) United States Patent
Doussiere

(10) Patent No.: US 7,960,743 B2
(45) Date of Patent: Jun. 14, 2011

(54) MULTI-ELECTRODE LIGHT EMITTING DEVICE

(75) Inventor: Pierre Doussiere, Sunnyvale, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 375 days.

(21) Appl. No.: 12/329,100

(22) Filed: Dec. 5, 2008

(65) Prior Publication Data

US 2010/0140632 A1    Jun. 10, 2010

(51) Int. Cl.
*H01L 33/00* (2010.01)
(52) U.S. Cl. ........... 257/88; 257/86; 257/89; 257/93; 257/98; 257/E33.001
(58) Field of Classification Search ........... 257/86, 257/88, 89, 93, 98
See application file for complete search history.

(56) References Cited

U.S. PATENT DOCUMENTS

| 6,184,542 | B1* | 2/2001 | Alphonse | 257/94 |
| 7,019,325 | B2 | 3/2006 | Li et al. | 257/14 |
| 2009/0294785 | A1* | 12/2009 | Cok | 257/98 |
| 2010/0219427 | A1* | 9/2010 | Fukuda | 257/89 |

* cited by examiner

*Primary Examiner* — Wai-Sing Louie
(74) *Attorney, Agent, or Firm* — Matthew A. Pequignot; Pequignot + Myers LLC

(57) ABSTRACT

The invention relates to a broad-band light emitting diode having an active layer composed of a plurality of light emission regions of differing materials for emitting light at a plurality of wavelengths, wherein each of the emission regions of the active layer is electrically controlled by a separate electrode for providing a broad-band emission or optical gain with a multi-point control of its spectral profile.

12 Claims, 9 Drawing Sheets

MULTI-ELECTRODE LIGHT EMITTING DEVICE

TECHNICAL FIELD

The present invention generally relates to semiconductor light emitting devices, and more particularly relates to multi-electrode superluminescent semiconductor diodes with broad emission spectrum.

BACKGROUND OF THE INVENTION

Semiconductor light emitting devices such as laser diodes, light emitting diodes and superluminescent diodes (SLD) are extensively used in many applications. Some of these applications require emitters that combine high brightness with a very broad optical spectrum, preferably as broad as tens or even hundredth nanometers (nm); these applications include the optical coherence tomography (OCT), low-coherence spectroscopy, and broad band optical amplification in an optical amplifier or tunable laser. For such application the superluminescent diodes, which provide optical amplification in the absence of lasing and are therefore characterized by a relatively high emission intensity in combination with a relatively broad optical spectrum, are typically used.

However, the emission bandwidth of a conventional SLD is limited by its material properties, which define the spectral shape and width of the SLD emission for a device of a given length. The emission spectrum of a typical SLD has a full width half maximum (FWHM) bandwidth $\Delta\lambda$ of about 2-2.5% of its peak wavelength $\lambda$, so that a 1550 nm SLD would typically emit light having the FWHM bandwidth of about 35 nm, while such applications as low-coherence interferometers would benefit from a light source with a much broader spectrum, since their resolution is inversely proportional to the spectral bandwidth of the used light source.

A solution to this problem is proposed in U.S. Pat. No. 6,184,542 in the name of G. A. Alphonse, which discloses a multi-section GaAs based SLD shown in FIG. 1, which reproduces FIG. 4a of the '542 patent.

Similar to a conventional SLD, the device of Alphonse has an n type cladding layer 3 that is deposited on a substrate 2, which is followed by an active layer 10 and a p type cladding layer 5. The refractive index of the active layer 10 is greater than the refractive index of the two cladding layers 3, 5 to provide a waveguiding effect in the direction normal to the layers. A capping layer 6 is deposited on the p type cladding layer 5. After the capping layer 6 is deposited, photolithography and etching is performed to define the waveguide as a ridge 8 with channels 9 on the sides. The channels are patterned and the capping layer 6 and the cladding layer 5 are etched down to an etch stop layer, not shown, within the cladding layer 5. Thus, in the channels, a small portion of the cladding layer 5 overlies the active layer 10. A base electrical contact 1 is then deposited to overlie the surface of the substrate 2 opposite the n type cladding layer 3. The electrical contact 1 is an alloy including one or more of germanium, gold, and nickel. A dielectric is then deposited over the entire top surface of the structure. Using photolithography and etching, a stripe is opened over the ridge 8, and a metal, such as an alloy of titanium, platinum, and gold, is deposited therein on the capping layer 6 as a top electrical contact 7 in the stripe region to confine electrical current to the ridge region. The waveguide stripe of FIG. 1 is formed at an angle θ with respect to the facets a and b to avoid facet reflection, which would otherwise lead to the appearance of periodic undulations in the emission spectrum due to the etalon effect and, ultimately, to the spectrum narrowing due to lasing.

To broaden the SLD emission spectrum, the active layer 10 is formed of three neighboring emission layers 15, 20, 25 of differing material composition aligned along the length of the device as illustrated in FIG. 2 in cross-section, so that each material 15, 20, and 25 has a different bandgap and therefore different center emission wavelength, i.e. $\lambda_1$, $\lambda_2$, or $\lambda_3$, respectively. It is proposed in the '542 patent that, if these center emission wavelength are selected so that respective spectra of the amplified spontaneous emission (ASE) from each of the emission layers 15, 20, and 25 overlap, passing of a suitable electrical current between the electrical contacts 1 and 7 would produce broad-band light output from the device having a substantially flat spectrum in the $\lambda_1$ to $\lambda_3$ range with a FWHM spectral width $\Delta\lambda$ that is the sum of the FWHM spectral widths $\Delta\lambda_i$, i=1, 2, 3, of each individual ASE spectrum, $\Delta\lambda = \Delta\lambda_1 + \Delta\lambda_2 + \Delta\lambda_3$.

However, we found that an SLD of the type described in the '542 patent tends to have an un-even, rather than flat, emission spectrum that is difficult to control and that is typically less spectrally broad than expected on the basis of the bandgap spread of the used material, e.g. less broad than combined radiation from three conventional SLDs with the differing center emission wavelength $\lambda_1$, $\lambda_2$, and $\lambda_3$.

An object of the present invention is to overcome at least some of the deficiencies of the prior art by providing a multi-section semiconductor light emitting device having a plurality of light emission regions that are individually addressable electrically for emitting broad-band light with controllable spectral profile.

SUMMARY OF THE INVENTION

The invention relates to a broad-band light emitting diode having an active layer composed of a plurality of light emission regions of differing materials for emitting light at a plurality of wavelengths, wherein each of the emission regions of the active layer is electrically controlled by a separate electrode for providing an broad-band optical emission or broad-band optical gain with a multi-point control of the respective spectral profile.

In accordance with the invention, there is provided a light emitting diode (LED), comprising: a semiconductor heterostructure; a waveguide formed in said semiconductor heterostructure and having an output facet; a plurality of light emission regions of said semiconductor heterostructure disposed along the waveguide for emitting light thereinto, wherein each light emission region has a material composition for emitting light that is spectrally centered at a different light emission wavelength than other light emission regions; and, a plurality of electrical contacts for electrically pumping each of the light emission regions separately, so as to produce individually controllable light emission at each of the light emission wavelengths.

In one aspect of the invention, insulating regions are disposed in the semiconductor heterostructure between the electrical contacts for electrically insulating adjacent electrical contacts from each other.

One aspect of the present invention relates to the LED wherein the semiconductor heterostructure comprises a cladding layer disposed over the plurality of light emission regions, wherein a plurality of electrical contacts are disposed over the cladding layer each in electrical communication with a different one of the light emission region, and wherein the cladding layer comprises conducting regions for conducting electrical current from the electrical contacts through respective light emission regions, and insulating regions for preventing the electrical current from each of the electrical contacts to flow through more than one of the light emitting regions.

According to one aspect of the invention, the plurality of light emission regions includes at least two light emission regions of which a region further away from the output facet extends along the waveguide at a greater length than the region that is closer to the output facet.

BRIEF DESCRIPTION OF THE DRAWINGS

The invention will be described in greater detail with reference to the accompanying drawings which represent preferred embodiments thereof, wherein.

DETAILED DESCRIPTION

The prior art SLD having multiple emission layers of differing center emission wavelengths was discovered to have a significant limitation, which stems from an interdependence of electrical and optical emission properties of semiconductor heterostructures with p-n junctions, and which makes it difficult or even impossible to fully realize the potential bandwidth enhancement provided by the multi-section active layer.

Figure 1:
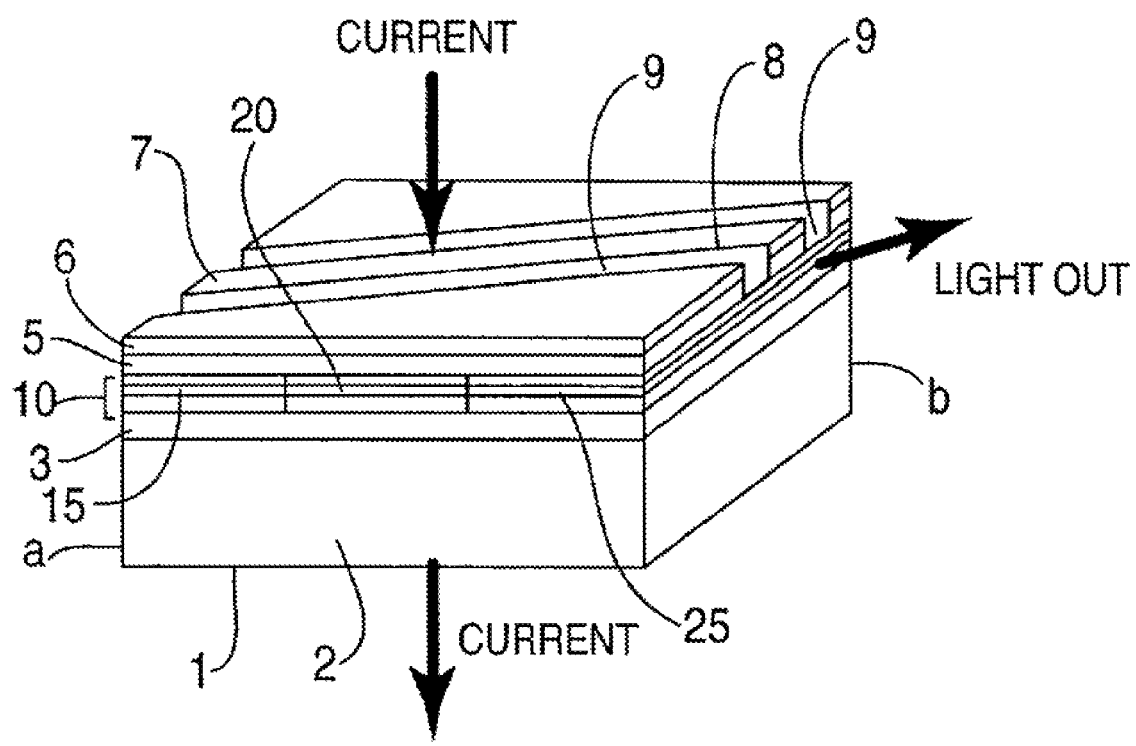
FIG. 1 is a diagram of a prior art multi-section superluminescent diode (SLD)
Figure 2:
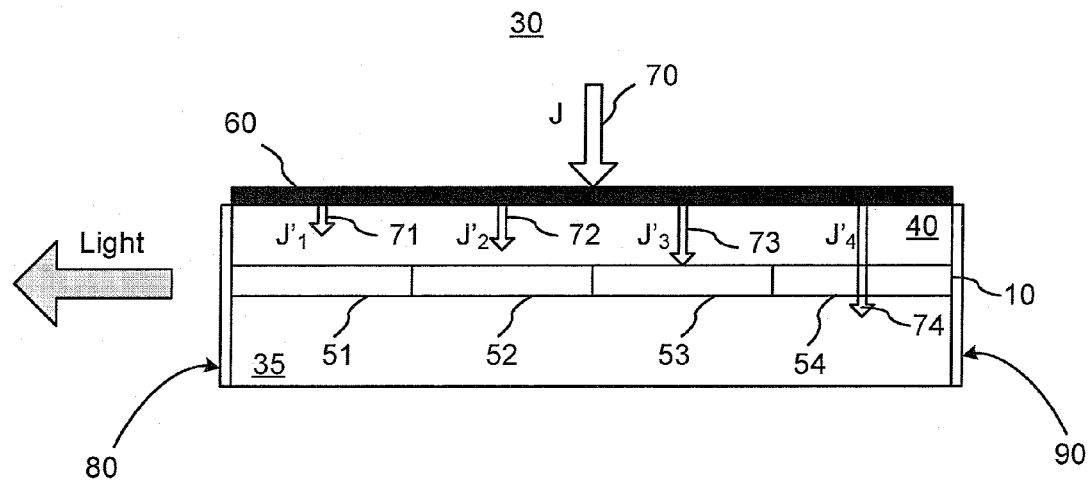
FIG. 2 is a cross-sectional diagram of a prior art SLD with a four-section active layer and a single top contact.

This limitation of the prior art multi-section SLD will now be explained with reference to FIGS. 2 and 3. Turning first to FIG. 2, there is shown by way of example a four-section SLD 30, which is similar to the SLD of FIG. 1 in every respect but the number of sections in the active layer 10. As shown in FIG. 2, the active layer 10 of the SLD 30 has four emission regions 51-54, which are aligned along the length of the device extending from an output front facet 80 to the back facet 90. These four emission regions 51-54 of the active layer 10 are sandwiched between two cladding layers 35, 40 providing waveguiding in the vertical direction; they are comprised of semiconductor materials having differing band gaps selected to provide emission spectra centered at four differing central emission wavelengths $\lambda_i$, i=1, ..., 4, with the emission regions having wider band gaps providing light emission at lower center emission wavelengths. The front facet 80 has an anti-reflection (AR) coating 81 and is the output facet of the device, while the back facet 90 has a reflective coating 91. As in the prior art SLD of FIG. 1, a single top electrode 60 is disposed over the entire active layer 10 to pump electrical current J 70 therethrough, so as to cause the emission regions 51-54 to emit light that is then guided to the front facet 80 for forming an output beam of the SLD 30.

One disadvantage of the SLD 30 is that the differing band gaps of the emission regions 51-54 result in differing resistivities thereof for any given voltage V that is applied to the electrode 60, yielding an inhomogeneous flow of the electrical current through the emission layers 51-54. This inhomogeneous current flow in the SLD 30 is schematically illustrated with arrows 71-74 of differing lengths representing differing electrical currents $J'_1 < J'_2 < J'_3 < J'_4$ which flow through the sections 51-54. Here, $J=J'_1+J'_2+J'_3+J'_4$, with comparatively stronger currents $J'_3$, $J'_4$ flowing through sections 53, 54 having narrower band gaps and thus having larger center emission wavelengths 3, 4, respectively.

Figure 3:
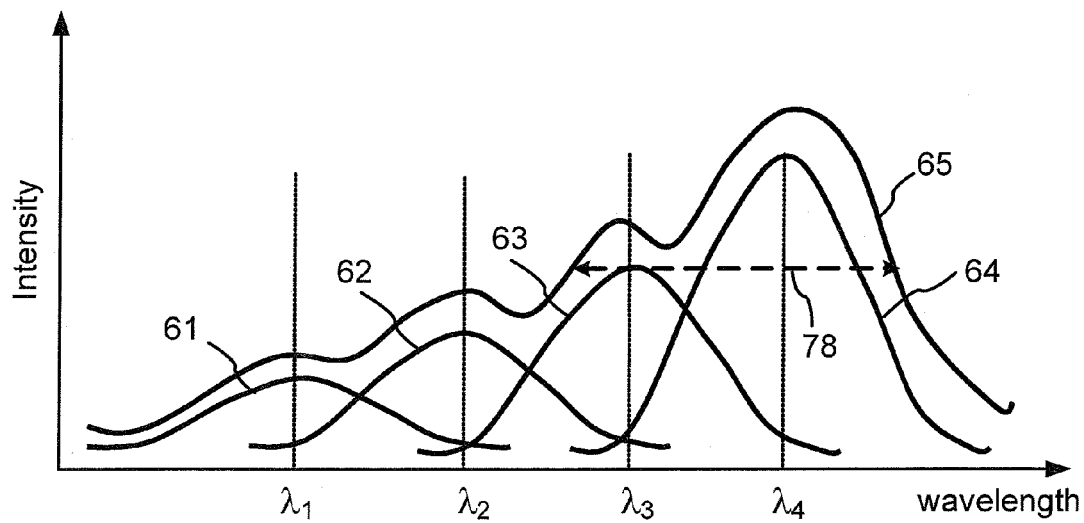
FIG. 3 is a graph illustrating an un-even emission spectrum of the prior art SLD of FIG. 2.

Turning now to FIG. 3, the non-uniform current flow in the SLD 30 provides non-equal electrical pumping of the emission regions 51-54, which in turn results in different amount of light emitted by each of these emission regions. The corresponding light emission spectra from the emission regions 51, 52, 53, and 54 are shown with curves 61, 62, 63 and 64. As illustrated by the emission spectra 61-64, when a voltage of a suitable polarity is applied to the electrode 60, emission regions 51-54 emit light with optical spectra 61-64, respectively, which are centered at the corresponding center emission wavelengths $\lambda_1$, $\lambda_2$, $\lambda_3$, and $\lambda_4$. The emission spectra 61-64 differ in intensity, with the regions having higher bandgaps and therefore lower center emission wavelengths receiving less current and therefore emitting less light. Accordingly, light emitted from the output facet 80 of the SLD 30 has a summary optical spectrum 65 that is non-flat, and has a generally asymmetric triangular shape with an extended short-wavelength tail, resulting in a FWHM bandwidth 78 that may be significantly less than the wavelength spread $\Lambda=(\lambda_4-\lambda_1)$ between the central emission wavelengths of the emission regions 51-54, and less than the sum $(\Delta\lambda_1+\Delta\lambda_2+\Delta\lambda_3+\Delta\lambda_4)$ of the FWHM bandwidths $\Delta\lambda_i$ of light emission from the individual sections 51-54.

The present invention improves upon the prior art by providing a semiconductor light emitting diode (LED) that is free from the above described limitation. The term "LED" as used herein includes both conventional light emitting diodes that operate without light amplification in their active regions and superluminescent diodes (SLD) which in operation exhibit significant positive optical gain in the active region of the device without lasing. The improved LED is comprised of a semiconductor heterostructure with a waveguide formed therein, with a plurality of light emission regions of differing materials and central emission wavelengths disposed along the waveguide for emitting light thereinto, and further having a separate dedicated electrical contact, or electrode, for electrically pumping each of the multiple emission regions separately with a suitable electrical current, so as to produce individually controllable light emission at each of the light emission wavelengths. Means for electrically isolating each of these electrodes from all but a respective one of the emission regions may further be provided. By applying generally differing individually controlled voltages to each of these electrodes, the electrical currents flowing through each of the multiple emission layers of the LED can be individually adjusted to provide a desired spectral profile of the overall LED emission.

Figure 4:
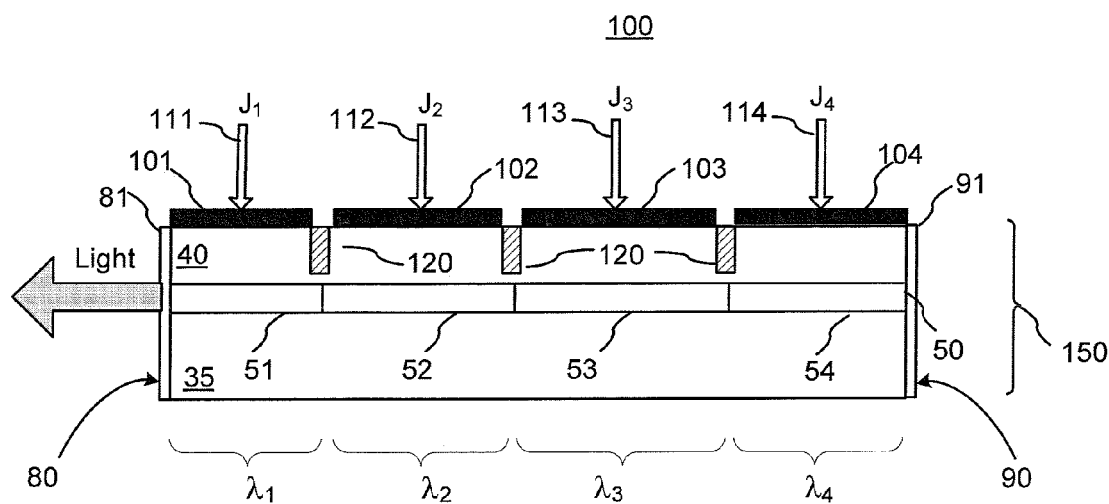
FIG. 4 is a cross-sectional diagram of a four-section LED with four separate top electrical contacts according to the present invention.

These and other features of the present invention will now be first described with reference to FIG. 4 schematically showing an exemplary LED 100, which is in many aspects similar to the SLD 30 of FIG. 2, but includes four separate electrically isolated electrical contacts 101-104 instead of the single electrode 60. In FIG. 4, elements similar to those described above with reference to FIGS. 1 and 2 are labeled identically and their description may be omitted for brevity. It will be appreciated that the LED 100 preferably includes a single-mode waveguide that is formed within the heterostructure 150 as known in the art extending between the front and back facets 80, 90, and FIG. 4 illustrates a vertical lateral cross-section of the LED 100 taken along said waveguide.

Similarly to the SLD 30, the LED 100 is based upon a semiconductor heterostructure 150 having the upper and lower cladding layers 40, 35 of opposite conductivity types, i.e. p and n, sandwiching the active layer 50 that is composed of the four butt-coupled emission regions 51-54 disposed in series between the AR-coated front facet 80 and the reflecting back facet 90. Each emission region 51, 52, 53 and 54 has a different center emission wavelength $\lambda_1$, $\lambda_2$, $\lambda_3$, and $\lambda_4$, respectively, as indicated in the figure. The cladding layers 40 and 35 have a high electrical conductivity suitable for enabling electrical current flow through the active layer 50 without substantial resistance, as is common in light-emitting semiconductor diodes.

In accordance with the invention, the semiconductor heterostructure 150 includes four separate electrodes 101-104, each associated with and disposed over a different emission region 51-54 and separated from neighboring electrodes by gaps, for electrically pumping each of the light emission regions 51-54 separately. The semiconductor heterostructure 150 preferably further includes insulation regions 120 that are disposed in between the electrical contacts 101-104 in the top cladding layer 40 to electrically insulate these contacts from each other. With these isolation, the electrical contacts 101-104 can be electrically biased at differing voltages independently of each other, for passing individually controllable electrical currents $J_1$, $J_2$, $J_3$ and $J_4$ 111-114 through the emission layers 51, 52, 53 and 54, respectively. Accordingly, the LED 100 may be considered as composed of four emission sections formed in the single heterostructure 150 and butt-coupled in series between the front and back facets 80 and 90, each including one of the emission regions 51-54 and a corresponding electrical contact 101-104, respectively; these sections are indicated in FIG. 4 with horizontal brackets and labeled according to their respective center emission wavelengths $\lambda_1$, $\lambda_2$, $\lambda_3$, and $\lambda_4$. Although the LED 100 is shown to have four different emission regions in its active layer 50 and thus composed of four different sections, in other embodiments the number of emission regions N may be 2 or higher. These emission regions are disposed in series so that they preferably form a single mode waveguide, so that the optical mode that is guided in this waveguide when these emission sections are suitably biased travels successively through each section before exiting the device from the output facet 80 in the form of a diverging optical beam.

In operation, each of the electrodes 101-104 is used for independently biasing the respective emission region 51-54 so as to and feed each of these regions with its own electrical current $J_i$, where i=1, . . . , 4, or, generally, i=1, . . . , N, as schematically shown in FIG. 4 with arrows 111-114. For each device section "$\lambda_1$", the light-versus-current characteristic I($J_i$), where I denotes the light emission intensity from the corresponding emission region, will typically behave exponentially at relatively law currents where the generated light is mainly dominated by spontaneous emission, changing to an approximately linear dependence at higher currents where the optical gain in the corresponding emission region 51, 52, 53 or 54 becomes positive and the emitted light is dominated by the amplification of the spontaneous emission. The transition to the ASE-dominated light for each of the electrodes 101-104 occurs at different applied voltages, since the corresponding underlying emission regions 51-54, through which the respective currents flow, have differing band gap energies and therefore differing voltages are required to achieve optical transparency of each of these regions.

Figure 5:
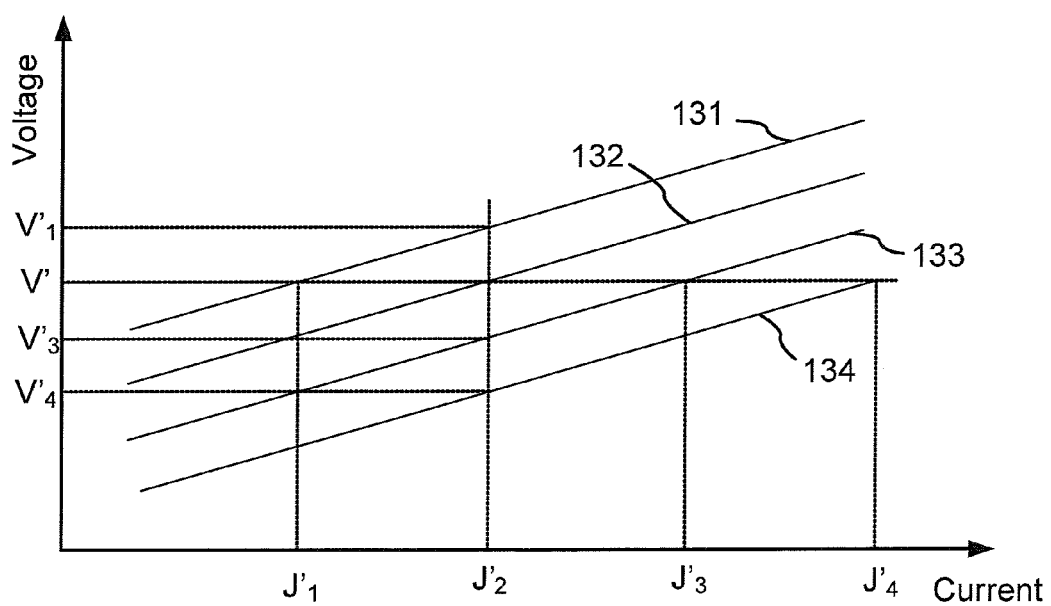
FIG. 5 is a graph illustrating voltage-current characteristics of the four emission regions of the devices of FIGS. 2 and 4.

FIG. 5 schematically illustrates portions of the voltage-versus-current characteristics V(J) 131-134 for the emission regions 51-54 and the corresponding electrodes 101-104, respectively. These characteristics relate voltages applied to each of the electrodes 101-104 to currents 111-114 flowing through the corresponding emission regions 51-54 disposed underneath the respective electrodes, so that, for example, the V(J) characteristic 131 relates voltage applied to the electrode 111 with current flowing through the emission region 51, resulting in the ASE at the central wavelength $\lambda 1$ being coupled into the waveguide of the LED 100.

When the same voltage V=V' is applied to each of the electrodes 111-114 of the LED 100, or, equivalently, this voltage is applied to the single electrode 70 of the SLD 30, electrical currents $J'_i$ flowing through the emission regions 51-54 all have different values, as illustrated in FIG. 5, resulting in differing intensities of the light emission therefrom, as the emission spectra 61-64 of FIG. 3 illustrate.

Advantageously, the electrical separation and isolation of the electrodes 101-104 from each other in the LED 100 of the present invention enables biasing of the emission regions 51-54 according to their respective energy band gaps. For example, FIG. 5 shows by way of illustration that, by applying different voltages $V_1=V'_1$, $V_2=V'$, $V_3=V'_3$, and $V_4=V'_4$ to the electrodes 101, 102, 103, and 104, respectively, each of the electrical currents $J_i$ flowing through the emission regions 51-54 of the active layer 50 will have the same value $J'_2$.

Figure 6:
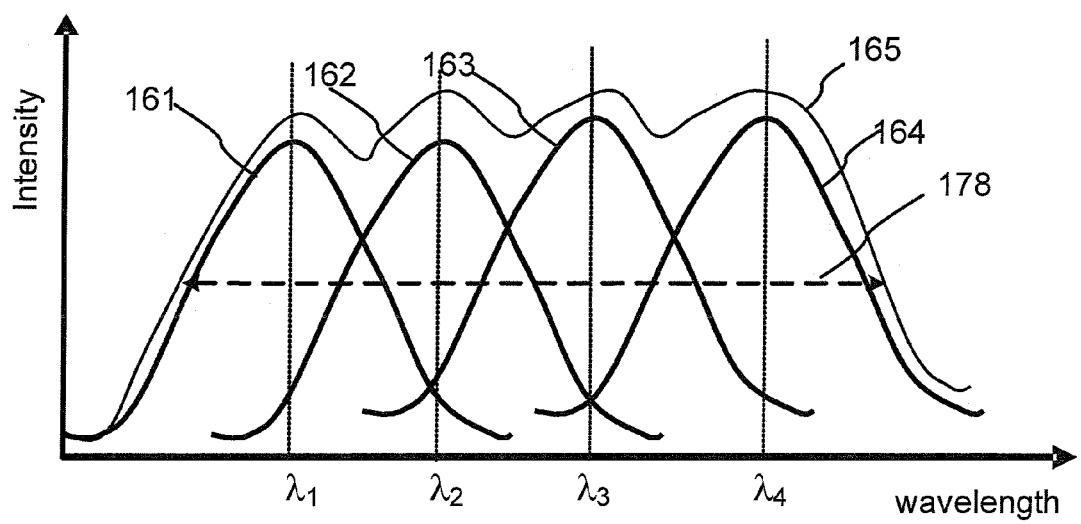
FIG. 6 is a graph illustrating a broad-band emission spectrum of the LED of FIG. 4.

Turning now to FIG. 6, this independent control of electrical biasing of each of the four emission regions 51-54 enables controlling the light emission from each of these four emission regions 51-54 independently of other regions. In particular, voltages applied to the electrodes 101-104 may be individually adjusted so as to equalize peak spectral intensities of light emission from the respective emission regains 51-54. For example, if the external quantum efficiency for each of the four emission regions 51-54 is substantially the same, applying the voltages $V'_1$, $V'_2$, $V'_3$, and $V'_4$ to the electrodes 101, 102, 103, and 104 results in light emission spectra 161-164 from the emission regions 51-54 that are of substantially equal intensity.

In an embodiment wherein the materials and band gap energies of the four emission regions 51-54 are such that the corresponding central emission wavelengths $\lambda_1$, $\lambda_2$, $\lambda_3$, and $\lambda_4$ are spaced apart according to the FWHM bandwidths $\Delta\lambda_i$ of the respective emission spectra 161-164 as shown in FIG. 6, the resulting summary emission spectrum 165 is comparatively broad and flat in the full wavelength range form $\lambda_1$ to $\lambda_4$ with a total FWHM width up to about $(\Delta\lambda_1+\Delta\lambda_2+\Delta\lambda_3+\Delta\lambda_4)$, so that the LED 100 provides a very broad-band emission that is desirable for a wide range of application including the OCT, low-coherence spectroscopy, and broad band optical amplification in an amplifier or a tunable laser.

In embodiments wherein the LED 100 is designed for use as a broad-band light source with controllable spectral profile, the different emission regions 51-54 are preferably arranged in such a way that the light emitted by each of these section into the waveguide towards the output facet 80 is not re-absorbed by the next section on its way to the output facet 80. To achieve this, the emission regions 51-54 are preferably disposed in ascending order of the center emission wavelengths from the output facet 80 on along the waveguide, or equivalently in order of increasing energy band gap values towards the output facet 80. In order to optimize the device and assist in achieving a flat emission spectrum, it may be advantageous to vary the lengths of the emission regions 51-54, that is make some of the emission regions longer or shorter than others. For example, emission regions with relatively narrower band gaps may be made longer than the emission regions with the wider band gaps, since they may experience more attenuation within the device. For example, light emitted by the smaller bandgap section 53 experiences additional optical losses as it travels through the wider band-gap sections 52 and 51 to reach the output facet 80. Increasing the length of the emission region 53 along the optical path of light in the active layer 50 enables increasing the current 114 in the section and therefore increasing the amount of light emitted by the section 54 from the output facet 80 of the LED 100 for the same applied voltage. Generally, the LED 100 may include at least two light emission regions of which a region having a greater light emission wavelength extends along the waveguide at a greater length. Alternatively or simultaneously, the LED 100 may include at least two light emission regions of which a region that is further away from the output facet 80 extends along the waveguide at a greater length than the region that is closer to the output facet. In some embodiments, the emission region 54 that is adjacent to the reflecting back facet 90 may be made shorter than one or all of the other emission regions of the LED 100 as light emitted by this region towards the back facet 90 is not lost but reflected towards the front facet 80.

The semiconductor heterostructure 150 utilized in the LED 100 may be composed of alloys of different semiconductor materials as known in the art including but not limited to AlGaAs/Gas, InGaAsP/InP, InAlGaAs/InP heterostructures, which may be grown on GaAs and InP substrates by suitable epitaxial techniques such as LPE (liquid-phase epitaxy), MBE (molecular beam epitaxy) and MOCVD (metallo-organic chemical vapor deposition). The InGaAsP/InP material system in particular is well suited to the fabrication of multi-sections devices and can also emit light over a wide range of wavelength, for example from 1100 nm up to 1650 nm, by adjusting ratios of the different component In, Ga, As and P.

The active layer 50 within each of the emission regions 51-54 may be comprised of multiple quantum wells (MQWs) or be a bulk material layer, depending whether a broad spectrum or a high spectral density of light emission is favored for a particular. When disposed between the oppositely doped cladding layers 35 and 40, the active layer 50 forms a p/n heterojunction therewith, preferably of a p/i/n (p-doped/non-doped/n-doped) type which is suitable for injecting and confining electrical carriers in the active layer 50. To achieve this, the cladding layers 35, 40 each have a wider bandgap than the active layer 50 in any of the emission regions 51-54, so as to confine the carrier injected therein. By way of example, the upper cladding layer 40 may be p-doped to a doping level between about $10^{17}$ and $1.5 \times 10^{18}$ cm$^{-3}$ and the lower cladding layer 35 may be n-doped to a doping level between $10^{17}$ and $2 \times 10^{18}$ cm$^{-3}$, with the material of the active layer 50 undoped so as to form the p/i/n junction. The wider bandgap materials that constitute the doped cladding layers 35, 40 preferably have lower refractive indices than the active layer 50 in order to form a single-mode optical waveguide in the direction normal to the plane of the layers that efficiently confines and guides the light in the active layer 50.

Referring now to FIGS. 7-10, exemplary material compositions and fabrication steps of a multi-section broad-band LED of the present invention will now be described more in detail with reference to a three-section LED 200, which utilizes an InGaAsP/InP material system and a single-mode waveguide 230.

Figure 7:
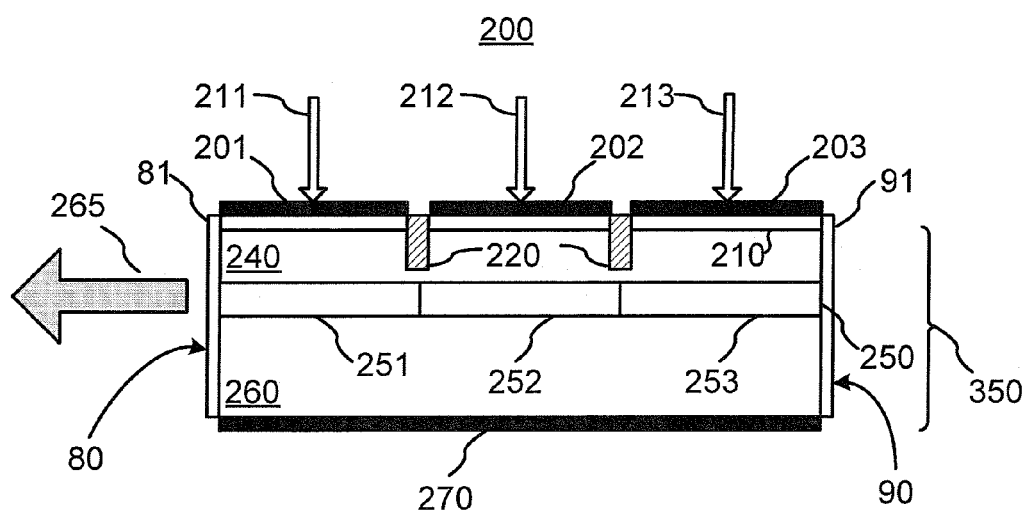
FIG. 7 is a diagram illustrating a longitudinal cross-section of a three-section LED with three separate electrical contacts.
Figure 8:
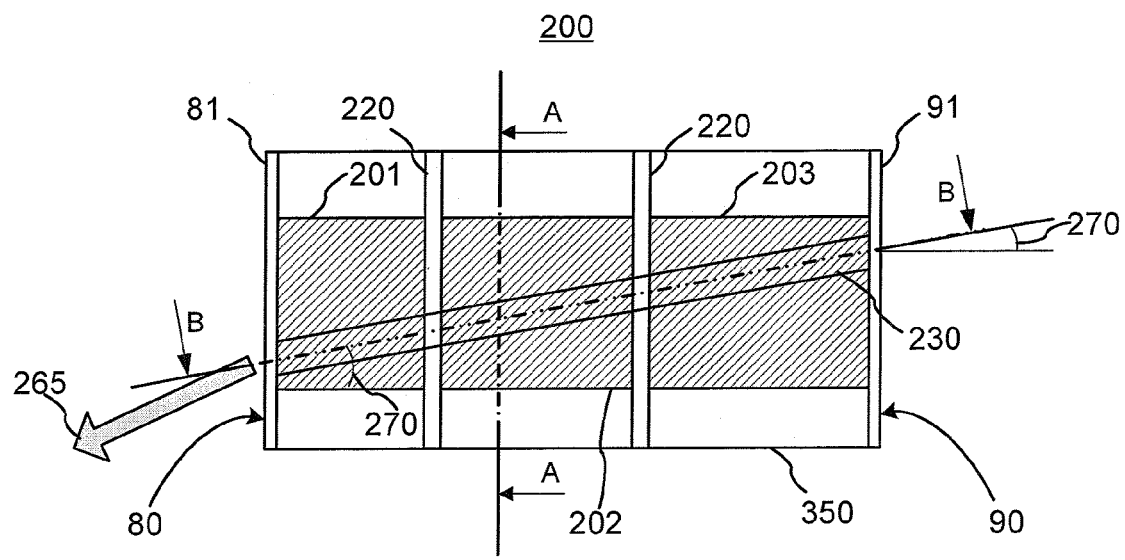
FIG. 8 is a diagram illustrating a top view of the three-section LED of FIG. 7.

In FIG. 7 the LED 200 is shown in a longitudinal vertical cross-section "B-B" along the waveguide 230, which is indicated in FIG. 8 that shows a top view of the device. An active layer 250 is epitaxially grown, for example using the MOCVD technology, over a conducting substrate 260 composed of n-doped InP that may be about 100 um thick and may have a concentration of donor impurities, for example Si, of about $5 \times 10^{17}$ cm$^{-3}$. In this exemplary structure, the substrate 260 functions as the lower cladding layer and may have a buffer layer of n-doped InP or InGaAsP material grown on top of it; the substrate 260 will be referred to hereinafter also as the first cladding layer.

The active layer 250 may be about 200 nm thick and is composed of three different InGaAsP alloys, with differing proportions of its constituent elements In, Ga, As, and P in the emission regions 251-253, which are aligned adjacently to each other along the optical path. Particular material compositions of the emission regions 251-253 are selected so as to provide three different band gap values according to desired center emission wavelengths $\lambda_1$, $\lambda_2$, and $\lambda_3$ of the light emission from these regions 251-253. The light emission regions 251-253 may be disposed in ascending order of the center emission wavelengths from the output facet 80 along the waveguide, so that light from emission regions of a comparatively wider band gap and therefore smaller wavelength would not have to propagate through an emission region of a comparatively narrower bandgap on its way to the output facet 80.

The upper cladding layer 240 that is disposed over the undoped active layer 250 may be about 1.5 um thick and composed of p-doped InP that is doped with an appropriate acceptor doping material such as Zn to provide acceptor concentration on the order of $5 \times 10^{17}$ cm$^{-3}$.

A thin contact layer 210 that is heavily p-doped is disposed over the upper cladding 240; it may be about 100 nm thick and comprised of $In_{0.53}Ga_{0.47}As_1$ doped with a suitable dopant such a Zn to an acceptor concentration of $1 \times 10^{18}$ cm$^{-3}$ or higher. Three separate electrical contacts 201-203 are disposed over the contact layer 210 in electrical communication with one and only one of the light emission regions 251-253, and are preferably in a vertical alignment with the corresponding one of the emission regions 251-253, as illustrated in FIGS. 7 and 8. The upper cladding layer 240 includes conducting regions that are directly under the electrical contacts 251-255, and insulating regions 220 that electrically separate and isolate the electrodes 251-253 from each other. By way of example, the insulation regions 220 are about 15 microns (um) long between the electrodes, and may be formed for example by proton implantation, preferably providing at least 1 kilo Ohm or as high as 1 Mega Ohm resistance between any two of the electrical contacts 251-253. In other embodiments, the insulation regions 220 may be formed using other techniques, for example by etching away portions of the cladding layer 240 between the electrical contacts 251-253, and optionally filling the resulting groves with a non-conducting material.

The substrate 260 has a metalized lower surface that forms a base electrical contact 270 that is common for all light emission regions 251-253; for this contact, a suitable n-type metallization such as the metal alloy Ti (200 nm)/Pt (200 nm)/Au (200 nm) may be conveniently used.

By way of example, the material composition of the first emission region 251 may be $In_{0.75}Ga_{0.24}As_{0.51}P_{0.48}$ resulting in operation in a first ASE spectrum having the first central emission wavelength $\lambda_1$ of about 1250 nm, material composition of the second emission region 252 may be $In_{0.66}Ga_{0.34}As_{0.71}P_{0.29}$ resulting in a second ASE spectrum having the second central emission wavelength $\lambda_2$ of about 1400 nm, and material composition of the third emission region 253 may be $In_{0.59}Ga_{0.4}As_{0.87}P_{0.13}$ resulting in a third ASE spectrum having the third central emission wavelength $\lambda_3$ of about 1550 nm. When suitable voltages are applied to the electrical contacts 201-203 so as to individually bias the respective emission regions 251-253 at pre-determined differing levels corresponding to their band gap values, the LED 200 emits light beam 265 from the output facet 80 having an optical spectrum with a total FWHM spectral width in excess of 300 nm. It will be appreciated that other compositions of the emission regions 251-253 of the active layer 250 are also possible, depending on the desired values of the central emission wavelengths $\lambda_1$, $\lambda_2$, and $\lambda_3$ and the desired spectral shape of the output light 265.

Figure 9A:
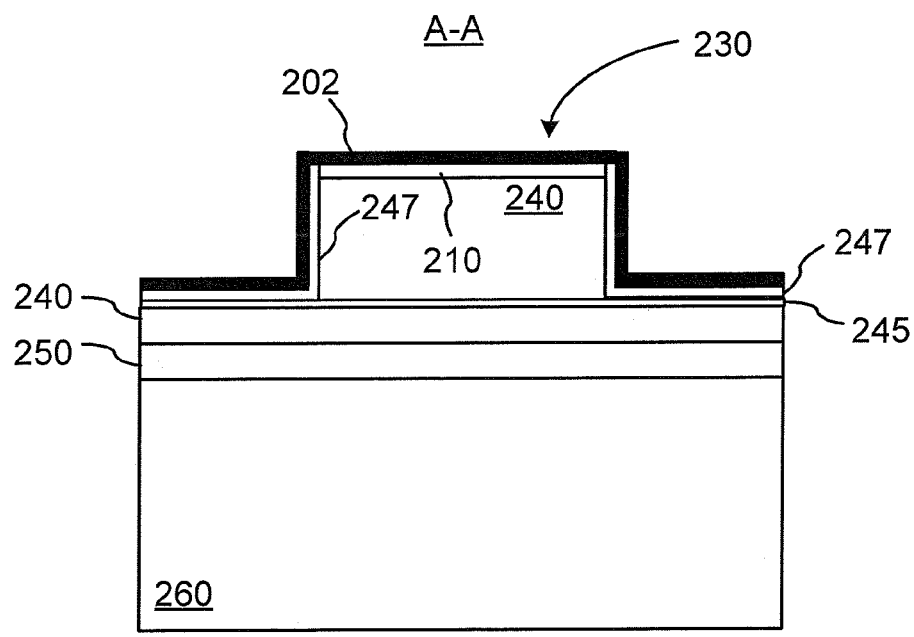
FIG. 9A is a diagram illustrating an embodiment of the LED of FIGS. 7,8 with a ridge waveguide structure in a lateral cross-section thereof.
Figure 9B:
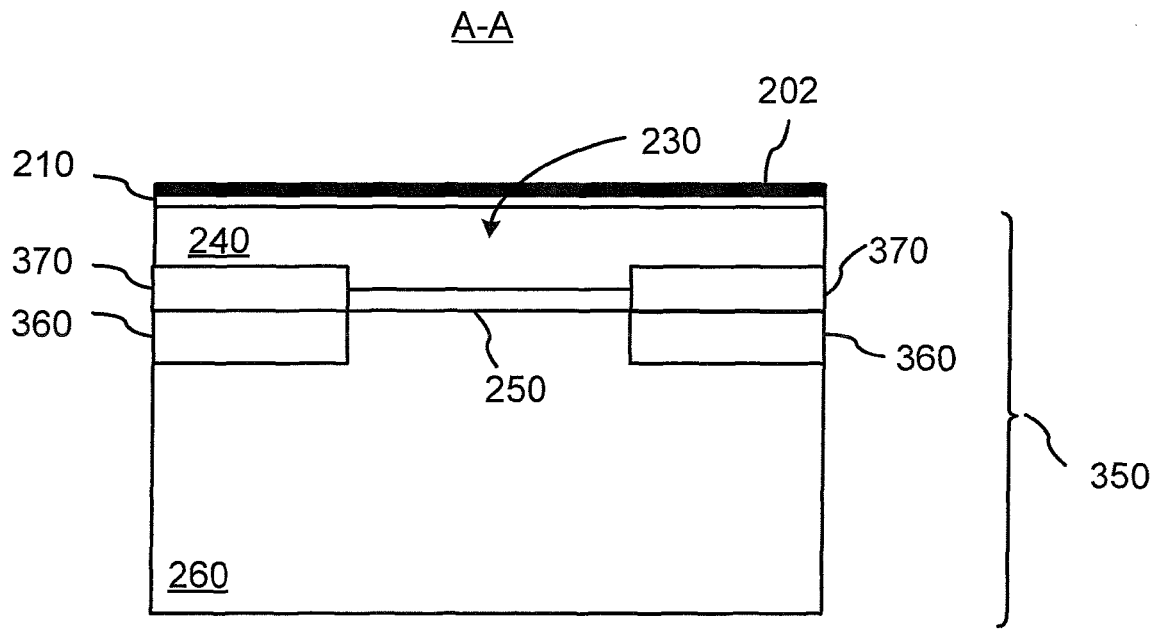
FIG. 9B is a diagram illustrating an embodiment of the LED of FIGS. 7,8 with a buried waveguide structure in a lateral cross-section thereof.

Turning now to FIG. 8 showing a top view of the LED 200, the waveguide 230 may be formed as a stripe extending in the heterostructure 350 from the output facet 80 to the back facet 90 for providing lateral optical confinement; it is preferably single-mode and may be about 3 µm wide. The waveguide 230 may be either a ridge waveguide as illustrated in FIG. 9A, or may be buried within the heterostructure 350, for example as illustrated in FIG. 9B. Alternative waveguiding structures, such as those employed in various types of edge-emitting semiconductor laser diodes or conventional LEDs may also be used.

The front facet 80, which is typically cleaved but may also be etched, is preferably coated with a suitable anti-reflection coating as known in the art in order to avoid the appearance of undulations in the emission spectrum of the LED 200 associated with an optical cavity. The back facet 90 may be either antireflection coated if the LED 200 is to be utilized as a wide-band amplifier, or high-reflection coated to force most of the light generated in the emission regions 251-253 to be emitted by the front facet 80 if the LED 20 is to be used as a broad-band emission source.

The waveguide 230 is preferably tilted with respect to the output facet 80 in the plane of the heterostructure 350 and the substrate 260, so as to further reduce the amount of light that can be reflected back into the waveguide 230 by the facets in order to eliminate ripples in the spectrum of the emitted light 265 due to a residual cavity effect. The tilt angle 270, that is as an angle between a line normal to the front facet 80 and an optical axis of the waveguide 230 indicated with arrows "B", may for example be between 5 and 10 degrees. The two arrows "B" also indicate the plane of the vertical cross-section of the LED 200 that is shown in FIG. 6.

The electrical contact pads 201-203 are shown disposed over the waveguide 230 in vertical alignment with the emission regions 251-253, and are physically and electrically separated from each other by the insulation regions 220.

Referring now to FIG. 9A, a lateral vertical cross-section of the LED 200 along the line "A-A" indicated in FIG. 7 is shown, illustrating an embodiment wherein the waveguide 230 is a ridge waveguide formed by etching away the top cladding layer 240 on both sides of the ridge using for example the reactive ion etch (RIE) or other suitable technique as known in the art. A thin etch stop layer 245 can be used to stop the etch process and to leave a thin protective layer of the top cladding material over the active layer 250 in the etched areas on both sides of the ridge waveguide 230. A dielectric layer 247 is deposited on both sides of the ridge prior to the deposition of the metal layer 202 to electrically isolate the metal layer 202 from the underlying heterostructure everywhere except on top of the ridge waveguide 230, to confine the flow of the electric current 212 to the ridge area.

Referring now to FIG. 9B, another possible embodiment of the LED 200 is schematically illustrated by way of example, wherein the waveguide 230 has a buried stripe structure as known in the art, wherein the active layer 250 is etched away on both sides of the waveguide 230 and is laterally confined between wider band gap materials 370/360, for example InP, to create the waveguiding effect in the lateral direction; these materials also conveniently function as the current blocking layers, with the n-doped blocking layers 370 being imbedded in the top p-doped cladding layer 240, and the p-doped blocking layer 360 being imbedded in the lower n-doped cladding layer 260.

The LED 200 can be fabricated using known semiconductor processing techniques that are commonly used in different combinations in fabrication of edge-emitting semiconductor lasers, semiconductor amplifiers and conventional light-emitting diodes. The fabrication process includes multi-step epitaxial re-growth since each section needs a different material composition in at least the active layer 250. MOCVD is one growth technique that can be used to growth the different layers of material, but MBE can also be used. Each growth step is followed by a selective etching step where part of the previously grown active layer 250 is removed to provide an area to grow a next emission region. The different emission regions are therefore "butt-coupled" to each other allowing the light to travel from a section to another with almost no optical losses. Once all the sections of the active layer are grown, the top cladding layer of lower refractive and wider bandgap semiconductor, for example InP, is grown over all sections. The waveguide is then formed using successive lithography, etching and re-growth steps. The electrical isolation between the sections may be obtained by first introducing a proton (H+) implantation in the cladding layer between the sections and by removing the metallic electrode as well as the highly doped contact layer between the sections. More than 1 Mega Ohms of electrical insulation can be achieved using this configuration. The devices are then cleaved and the anti-reflection or reflective coatings are deposited on the cleaved facets. Next the device is soldered on a carrier that provides thermal dissipation (Copper, Aluminum nitride or Copper/Tungsten or Silicon).

The fabrication steps outlined hereinabove will now be described in further detail by way of example as applied to the LED 200 and with reference to FIGS. 10A-10M; it will be appreciated that variations of this fabrication process or a different fabrication process may also be used. In FIGS. 10A-10M and in the following description, the materials of the emission regions 251, 252, and 253 will be referred to as the first, second and third emission materials, respectively, and layers of these materials are indicated with the same reference numerals as the emission regions formed therefrom.

Figure 10A:
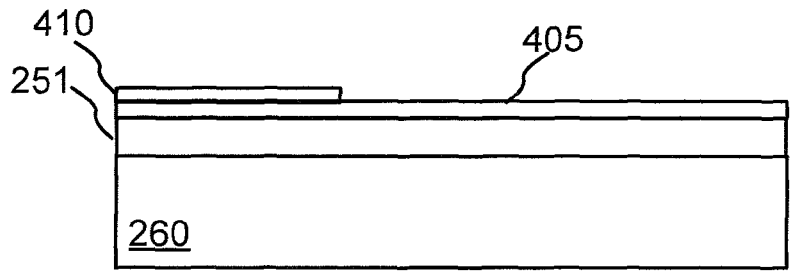
FIGS. 10A-10L are schematic diagrams illustrating various fabrication steps of the LED of FIGS. 7-9A.

Turning first to FIG. 10A, a layer of the first emission material 251 is epitaxially grown over the substrate 260, which may include a top buffer layer as known in the arts. A protective layer 405 of a suitable semiconductor material is then deposited on the layer of the first emission material 251, and lithographically patterned with a dielectric mask 410 to cover the area of the first emission region.

Figure 10B:
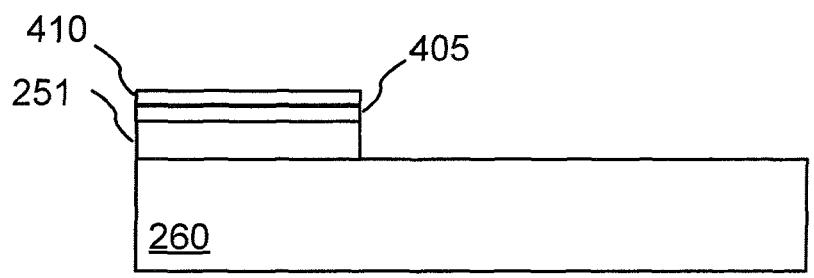
Figure 10C:
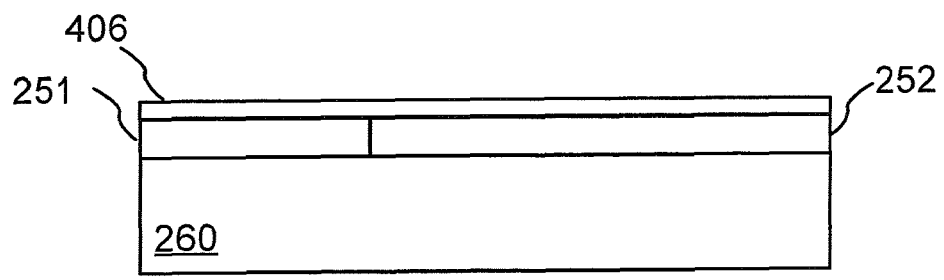

Next, the first emission material 251 is etched away everywhere but in the first emission region, as shown in FIG. 10B, and the etched areas are re-grown with a layer of the second emission material 252, after which the dielectric mask 410 and the protective layer 405 are removed.

Figure 10D:
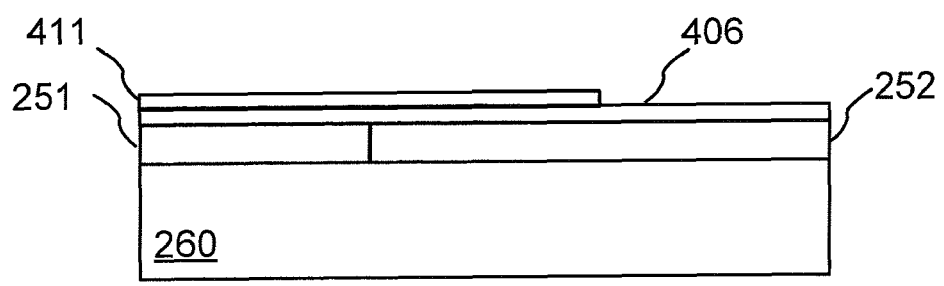
Figure 10E:
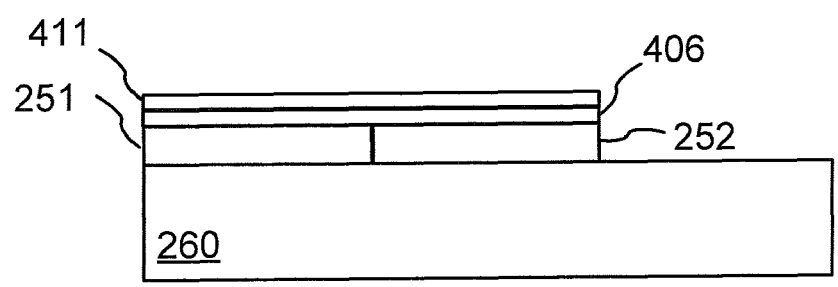
Figure 10F:
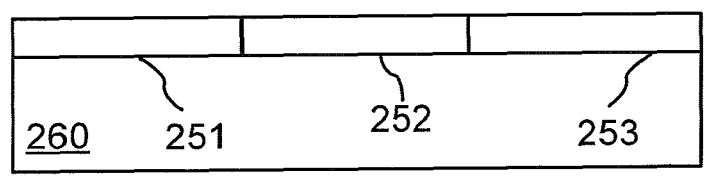

Next, the structure is covered with a new protective layer 406 as shown in FIG. 10C, which is again lithographically patterned with the dielectric mask 411 to expose the area of the third emission region by selectively etching away an exposed portion of the second emission material 252, which is then re-grown with the third emission material 253 as illustrated in FIGS. 10D-10F.

Figure 10G:
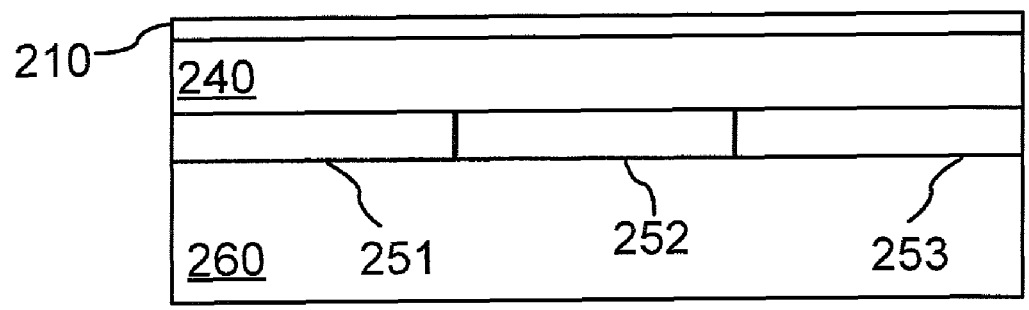

Once all three emission regions 251-253 of the active layer 250 are formed with their respective emission materials, the top cladding layer 240 and the contact layer 210 are sequentially grown over the whole structure, as illustrated in FIG. 10G.

Figure 10H:
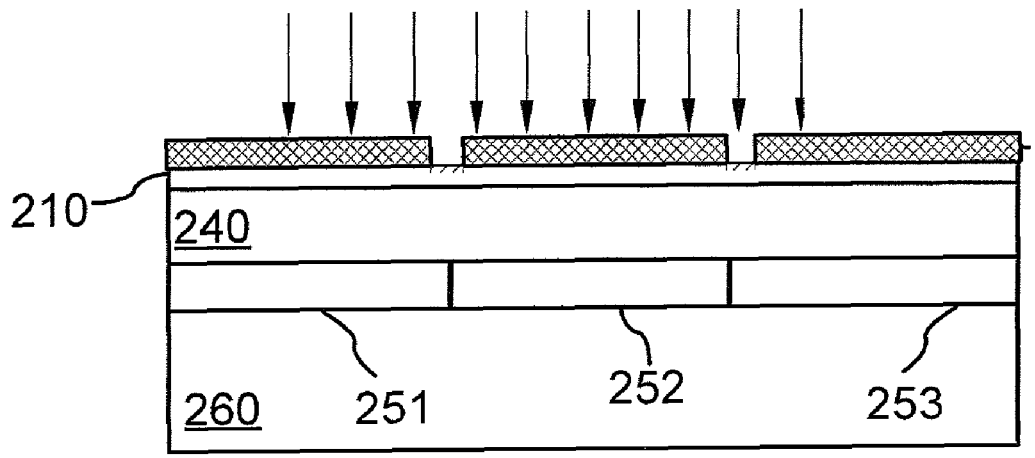
Figure 10I:
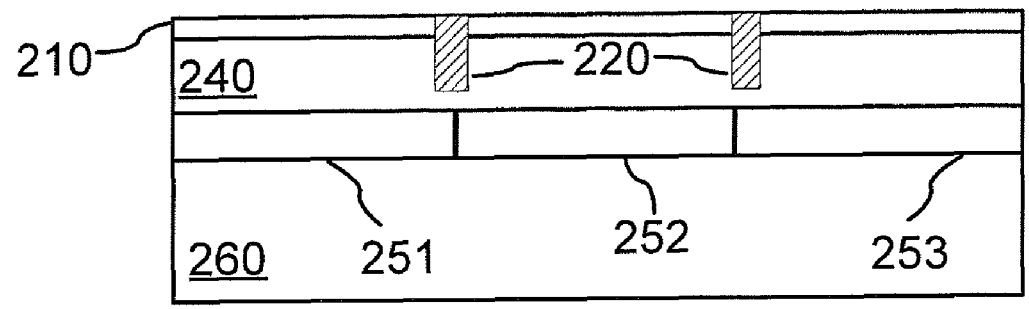

Next, the structure is patterned with a photoresist 430 or other suitable masking material as shown in FIG. 10H, exposing the contact layer only where the insulation areas 220 are to be formed, and the so patterned structure is then subject to proton implantation as schematically illustrated by arrows 435 to passivate the exposed areas and to form the insulation areas 200, which now have a suitably low conductivity, preferably at least two or three orders of magnitude less than the conductivity of the cladding layer 240 prior to the proton implantation.

Next, the photoresist 430 is stripped resulting in a structure illustrated in FIG. 10T, and the ridge waveguide 230 is formed as known in the art and as briefly outlined hereinabove with reference to FIG. 8.

Figure 10J:
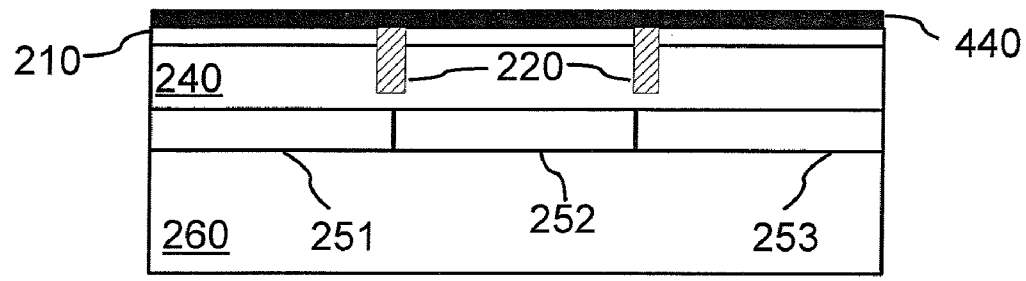
Figure 10K:
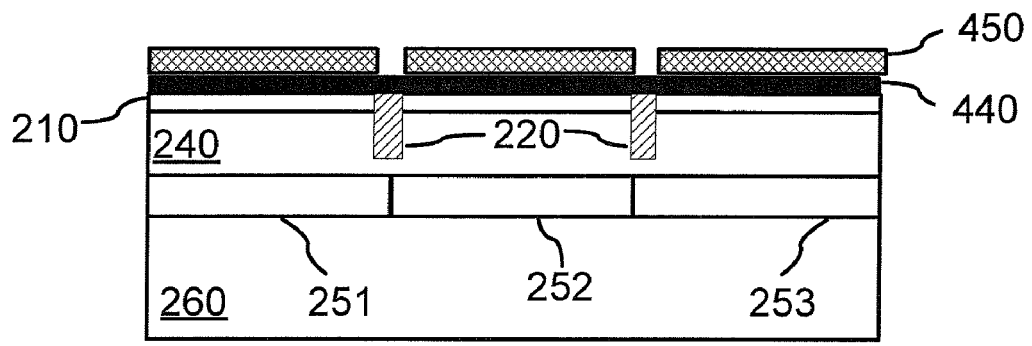
Figure 10L:
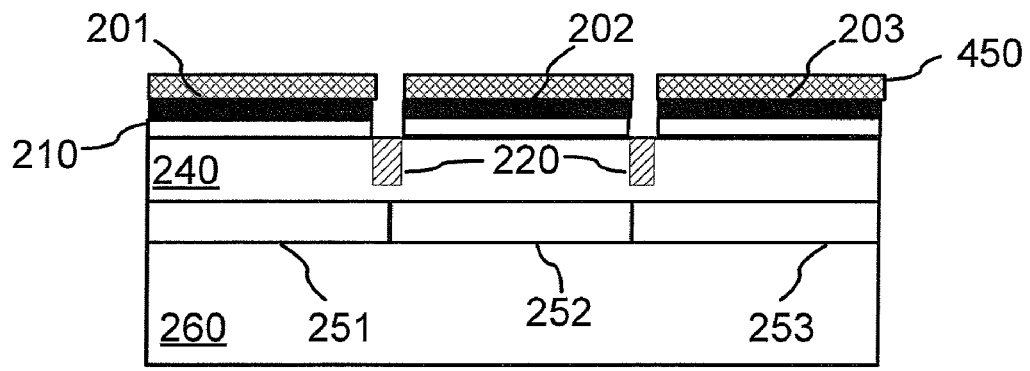

Following the formation of the ridge waveguide 230, a p-type metal contact layer 440 is deposited over the structure in the area of the waveguide 250 as illustrated in FIG. 10J, which is then lithographically patterned as illustrated in FIG. 10K to define the three separate top electrical contacts 201-203 by exposing the metal layer between the electrical contacts 201-203. The metal layer 440 is then etched away in the exposed areas together with the contact layer 210 to form the three separate top electrical contacts 201-203, as illustrated in FIG. 10L and FIG. 7.

Finally, the structure is cleaved to form the front and back facets 80, 90 of the LED 200, which are then coated with the respective coatings 81, 91 as known in the art.

In operation, bias voltages $V_i$, i=1, 2, 3, of the proper polarity are individually applied to the electrical contacts 201-203 of the LED 200 to produce light emission in all three emission regions 501-503. The light emission from the emission regions 501-503 is individually controlled, thereby resulting in the output light 265 from the LED 200 that has the desired spectral profile, which may be substantially flat and broad-band. The individual control of the electrical currents 211-213 that pump the emission regions 251-253 enables to independently control the spectral intensity of the output light 265 in each of the ASE frequency bands about the central emission wavelengths $\lambda_1$, $\lambda_2$, and $\lambda_3$, thereby providing light having a spectral profile that can be controllably adjusted to a desired shape.

Although the invention has been described with reference to specific embodiments for the purpose of illustration, it should be understood that each of the preceding embodiments of the present invention may utilize a portion of another embodiment; persons skilled in the art will be able to modify these embodiments according to their specific requirements, and other embodiments are also possible within the scope of the invention. For example, the conductivity types of the described layers can all simultaneously be changed to their opposites, and additional layers may be present in the structure. Furthermore, although the specific sequences of the emission regions described hereinabove are advantageous for application wherein the LED of the present invention is used as a broad-band light source, in other applications such as broad-band light amplification a symmetrical arrangement of the light emission regions can be beneficial wherein the emission regions adjacent to the front and back facets are composed of a material of equal bandgap, with emission regions having a smaller bandgap disposed away from the facets in the middle of the device. An ordinary person in the art would be able to construct such embodiments without undue experimentation in light of the present disclosure.

Of course numerous other embodiments may be envisioned without departing from the spirit and scope of the invention.

I claim:

1. A light emitting diode (LED), comprising:
   a semiconductor heterostructure;
   a waveguide formed in said semiconductor heterostructure and having an output facet;
   a plurality of light emission regions of said semiconductor heterostructure disposed along the waveguide for emitting light thereinto, wherein each light emission region has a material composition for emitting light that is spectrally centered at a different light emission wavelength than other light emission regions; and,
   a plurality of electrical contacts for electrically pumping each of the light emission regions separately, so as to produce individually controllable light emission at each of the light emission wavelengths.

2. A LED of claim 1, comprising insulating regions disposed in the semiconductor heterostructure between the electrical contacts for electrically insulating adjacent electrical contacts from each other.

3. A LED of claim 2 wherein the light emission regions are disposed in ascending order of the light emission wavelengths from the output facet on along the waveguide.

4. A LED of claim 2 wherein the plurality of light emission regions includes at least two light emission regions of which a region having a greater light emission wavelength extends along the waveguide at a greater length.

5. A LED of claim 2 wherein the plurality of light emission regions includes at least two light emission regions of which a region further away from the output facet extends along the waveguide at a greater length than the region that is closer to the output facet.

6. A LED of claim 1 wherein the semiconductor heterostructure comprises a cladding layer disposed over the plurality of light emission regions, and wherein:
   the electrical contacts are disposed over the cladding layer each in electrical communication with a different one of the light emission region; and,
   the cladding layer comprises:
   conducting regions for conducting electrical current from the electrical contacts through respective light emission regions, and
   insulating regions for preventing the electrical current from each of the electrical contacts to flow through more than one of the light emitting regions.

7. A LED of claim 6 wherein the insulating regions of the cladding layer comprise proton implanted material.

8. A LED of claim 6 wherein there is at least 1 Kilo Ohm electrical resistance between any two of the electrical contacts.

9. A LED of claim 6 wherein the semiconductor heterostructure comprises a AlGaAs/Gas, InGaAsP/InP, or InAlGaAs/InP heterostructure having differing material compositions within the light emitting regions.

10. A LED of claim 6 wherein each of the light emitting regions comprises a p/i/n heterojunction wherein a middle intrinsic layer is sandwiched between a p-doped layer and an n-doped layer, and wherein each of the light emitting regions has a different bandgap in at least the intrinsic layer thereof.

11. A LED of claim 1 wherein the output facet comprises an anti-reflection coating.

12. A LED of claim 1 wherein the waveguide is slanted with respect to the output facet thereof to reduce back reflections.

* * * * *